(12) United States Patent
Nakaoka

(10) Patent No.: US 10,770,118 B2
(45) Date of Patent: Sep. 8, 2020

(54) REVERSE BIAS VOLTAGE ADJUSTER

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/543,629

(22) Filed: Aug. 19, 2019

(65) Prior Publication Data

US 2020/0227093 A1    Jul. 16, 2020

(30) Foreign Application Priority Data

Jan. 10, 2019    (JP) .................................. 2019-002694

(51) Int. Cl.
   *G11C 5/14*     (2006.01)
   *G11C 29/50*    (2006.01)
   *G01R 31/28*    (2006.01)
   *H03K 19/20*    (2006.01)

(52) U.S. Cl.
   CPC .......... *G11C 5/146* (2013.01); *G01R 31/2849* (2013.01); *G11C 29/50004* (2013.01); *G11C 2029/5004* (2013.01); *H03K 19/20* (2013.01)

(58) Field of Classification Search
   CPC ....... G01R 31/00; G01R 31/2849; G05F 3/00; G05F 3/205; G11C 2029/00; G11C 2029/5004; G11C 29/00; G11C 29/50004; G11C 5/00; G11C 5/146; H03K 19/00; H03K 19/0016; H03K 19/00384; H03K 19/20; H03K 2217/00; H03K 2217/0018

USPC .......................................................... 327/534
See application file for complete search history.

(56) References Cited

U.S. PATENT DOCUMENTS

| | | | |
|---|---|---|---|
| 5,513,091 A  * | 4/1996 | Uchida | H02M 3/07 363/60 |
| 10,416,693 B1 * | 9/2019 | Kim | H03K 17/6872 |
| 2009/0072857 A1 * | 3/2009 | Perisetty | H03K 19/0016 326/38 |

(Continued)

FOREIGN PATENT DOCUMENTS

| CN | 1538454 | 6/2010 |
|---|---|---|
| TW | I434281 | 4/2014 |

OTHER PUBLICATIONS

Office Action of Taiwan Counterpart Application, dated Jan. 6, 2020, p. 1-p. 5.

*Primary Examiner* — Lincoln D Donovan
*Assistant Examiner* — Dave Mattison
(74) *Attorney, Agent, or Firm* — JCIPRNET

(57) ABSTRACT

A reverse bias voltage adjuster is provided. The reverse bias voltage adjuster includes an operating voltage generating circuit and a voltage adjusting circuit. The operating voltage generating circuit generates an operating voltage according to a burnin-test signal, a power start signal, and a reverse bias enable signal. In a normal operation mode, the operating voltage is a first voltage value, and in a burnin-test mode, the operating voltage is a second voltage value, wherein the second voltage value is less than the first voltage value. The voltage adjusting circuit is provided with a switch, and in an initial time interval in the burnin-test mode, the voltage adjusting circuit adjusts voltage value of the reverse bias by turning on the switch.

10 Claims, 5 Drawing Sheets

(56) References Cited

U.S. PATENT DOCUMENTS

2009/0245009 A1 10/2009 Keeth et al.
2013/0039139 A1 2/2013 Raval et al.

* cited by examiner

REVERSE BIAS VOLTAGE ADJUSTER

CROSS-REFERENCE TO RELATED APPLICATION

This application claims the priority benefit of Japan application serial no. 2019-002694, filed on Jan. 10, 2019. The entirety of the above-mentioned patent application is hereby incorporated by reference herein and made a part of this specification.

BACKGROUND OF THE INVENTION

1. Field of the Invention

The present invention relates to a bias voltage adjuster, in particular, to a reverse bias voltage adjuster used in a memory.

2. Description of Related Art

In familiar memory technology, the steady state of a memory is generally tested by burnin-test. Moreover, the memory performs operational motion on each transistor by providing reverse bias voltage to a substrate of each transistor in a memory cell array.

However, when the memory operates in a burnin-test mode, these transistors are easily affected by the voltage values of the reverse bias voltage and a power supply voltage, resulting in the situation that a voltage difference between a source terminal and a drain terminal of each transistor easily exceeds a rated voltage scope, and then the operation of the whole memory is seriously affected. Therefore, how to effectively reduce the voltage difference between the source terminal and the drain terminal of each transistor and avoid the situation that these transistors are damaged when the memory operates in the burnin-test mode is an important subject of the art.

SUMMARY OF THE INVENTION

The present invention provides a reverse bias voltage adjuster. The reveres bias voltage adjuster reduces the voltage value of an operating voltage by utilizing an operating voltage generator when operating in a burnin-test mode, so that a voltage adjusting circuit further adjusts the voltage value of a reverse bias voltage according to the adjusted operating voltage.

The reverse bias voltage adjuster includes an operating voltage generating circuit and a voltage adjusting circuit. The operating voltage generating circuit generates an operating voltage according to a burnin-test signal, a power start signal, and a reverse bias enable signal, wherein in a normal operation mode, the operating voltage is a first voltage value, and in a burnin-test mode, the operating voltage is a second voltage value, wherein the second voltage value is less than the first voltage value. The voltage adjusting circuit is coupled to the operating voltage generating circuit, and is provided with a switch, wherein the switch is coupled to between transfer trajectories of a reference grounding voltage and a reverse bias voltage, and in an initial time interval in the burnin-test mode, the voltage adjusting circuit adjusts voltage value of the reverse bias voltage by turning on the switch.

Based on the foregoing, the reverse bias voltage adjuster provided by the present invention provides an operating voltage with the second voltage value less than the first voltage value by utilizing the operating voltage generating circuit in the initial time interval in the burnin-test mode. In this way, the voltage adjusting circuit maintains the voltage level of the reverse bias voltage at the voltage level of the reference grounding voltage according to the pulled-down operating voltage and the power start signal, and further effectively reduces a voltage difference between a source terminal and a drain terminal of each transistor in a memory cell array, so as to avoid the situation that these transistors are damaged.

To make the foregoing features and advantages of the present invention more comprehensible, preferred embodiments are described in detail below with reference to the accompanying drawings.

DESCRIPTION OF THE EMBODIMENTS

Figure 1:
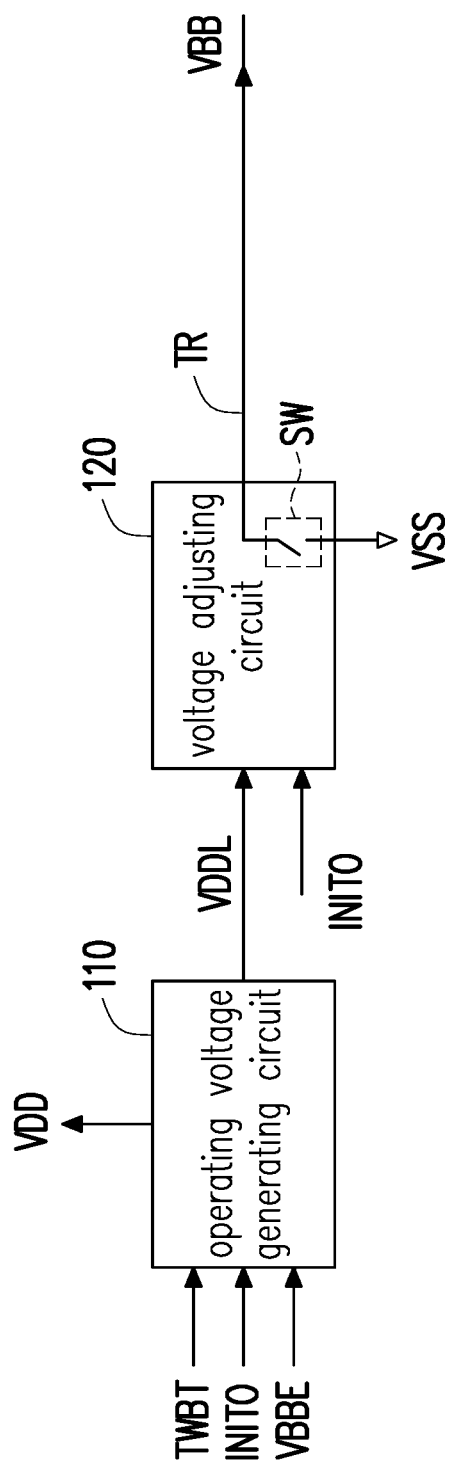
FIG. 1 is a schematic diagram of a reverse bias voltage adjuster according to an embodiment of the present invention.

FIG. 1 is a schematic diagram of a reverse bias voltage adjuster 100 according to an embodiment of the present invention. Please refer to FIG. 1, in the present embodiment, the reverse bias voltage adjuster 100 includes an operating voltage generating circuit 110 and a voltage adjusting circuit 120. The operating voltage generating circuit 110 receives a burnin-test signal TWBT, a power start signal INIT0 and a reverse bias enable signal VBBE, and generates an operating voltage VDDL according to the burnin-test signal TWBT, the power start signal INIT0 and the reverse bias enable signal VBBE.

The burnin-test signal TWBT is used for indicating whether the reverse bias voltage adjuster 100 executes a burnin-test. For example, when the reverse bias voltage adjuster 100 operates in a normal operation mode, the burnin-test signal TWBT is set as a first logic level (such as a low-voltage level), and when the reverse bias voltage adjuster 100 operates in a burnin-test mode, the burnin-test signal TWBT is set as a second logic level (such as a high-voltage level). Moreover, the power start signal INIT0 is used for indicating whether the voltage value of a power supply voltage VDD is greater than a certain preset voltage value. For example, when the voltage value of the power supply voltage VDD is less than the preset voltage value, the power start signal INIT0 is set as a first logic level (such as a low-voltage level), and when the voltage value of the power supply voltage VDD is greater than the preset voltage value, the power start signal INIT0 is set as a second logic level (such as a high-voltage level). A person of common knowledge in the art adjusts the preset voltage value according to the design requirement for the reverse bias voltage adjuster 100.

In another aspect, the voltage adjusting circuit 120 is coupled to the operating voltage generating circuit 110 to receive the operating voltage VDDL. The voltage adjusting circuit 120 is provided with a switch SW, wherein the switch SW is coupled between transfer trajectories TR of a reference grounding voltage VSS and a reverse bias voltage VBB.

Specifically, when the reverse bias voltage adjuster 100 operates in the normal operation mode, and the voltage value of the power supply voltage VDD is greater than the preset voltage value, the operating voltage generating circuit 110 generates the operating voltage VDDL with a first voltage value according to the enabled power start signal INIT0 and the disabled burnin-test signal TWBT. Correspondingly, when the reverse bias voltage adjuster 100 operates in the burnin-test mode, and the voltage value of the power supply voltage VDD is greater than the preset voltage value, the operating voltage generating circuit 110 generates the operating voltage VDDL with a second voltage value according to the enabled power start signal INIT0 and the enabled burnin-test signal TWBT. The second voltage value is less than the first voltage value.

In other words, when the reverse bias voltage adjuster 100 operates in an initial time interval in the normal operation mode and the burnin-test mode, the voltage adjusting circuit 120 turns on the switch SW according to the operating voltage VDDL and the power start signal INIT0, and maintains the voltage level of the reverse bias voltage VBB at the voltage level of the reference grounding voltage VSS by the transfer trajectory TR and the turning-on path of the switch SW.

It is known from the forgoing descriptions that, in the present embodiment, when the reverse bias voltage adjuster 100 operates in an initial time interval in the burnin-test mode, the reverse bias voltage adjuster 100 provides the operating voltage VDDL with a second voltage value less than the first voltage value to the voltage adjusting circuit 120 by utilizing the operating voltage generating circuit 110. In this way, although the voltage value of the power supply voltage VDD operating in the burnin-test mode needs to be higher than the voltage value of the power supply voltage VDD operating in the normal operation mode, the reverse bias voltage adjuster 100 enables the voltage level of the reverse bias voltage VBB to be maintained at the voltage level of the reference grounding voltage VSS according to the pulled-down operating voltage VDDL and the power start signal INIT0 by utilizing the voltage adjusting circuit 120, and further effectively reduces a voltage difference between a source terminal and a drain terminal of each transistor in a memory cell array, so as to avoid the situation that the transistors are damaged.

Figure 2:
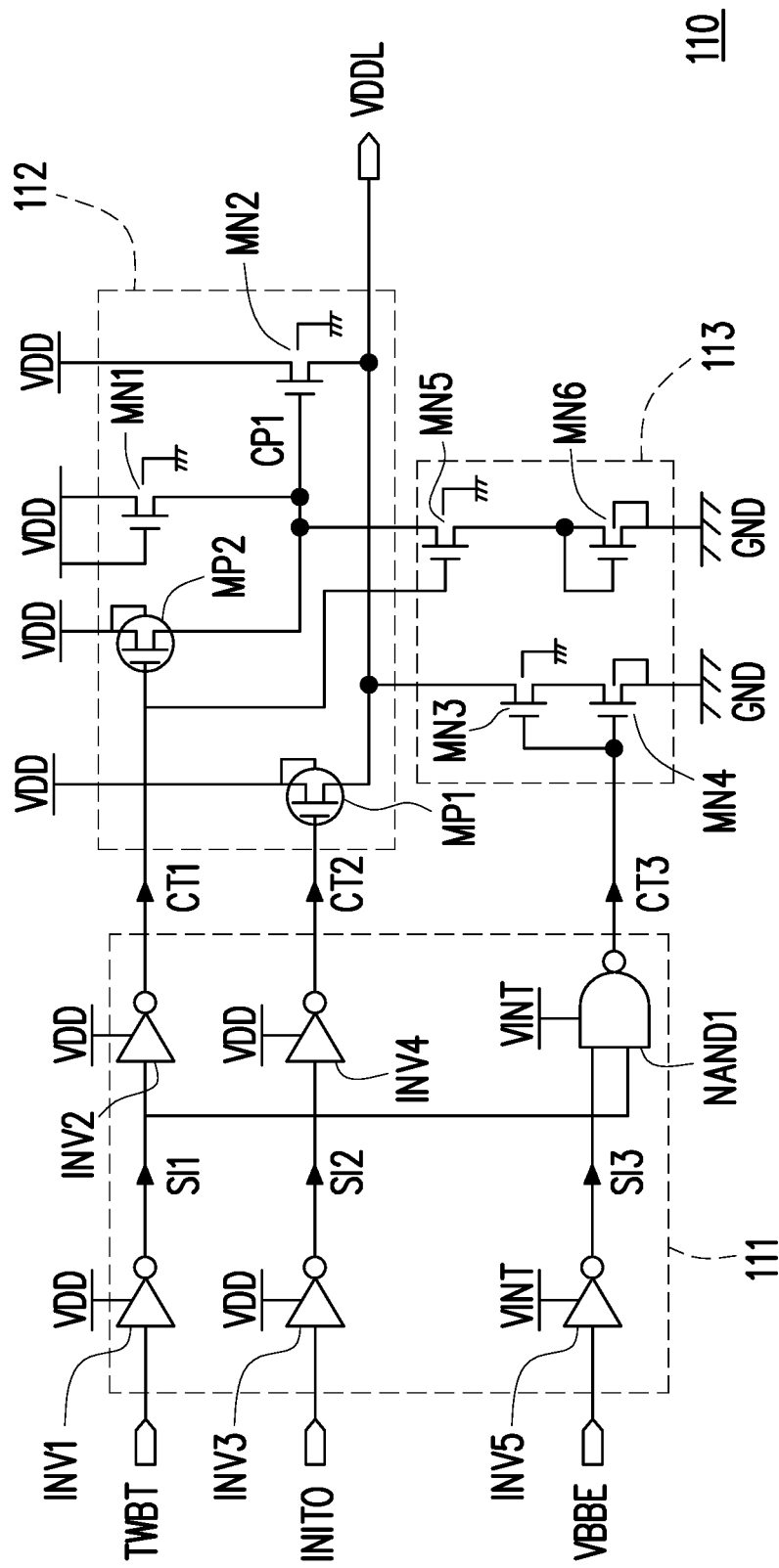
FIG. 2 is a circuit diagram according to an operating voltage generating circuit in FIG. 1 of the present invention.

FIG. 2 is a circuit diagram according to the operating voltage generating circuit 110 in FIG. 1 of the present invention. Please refer to FIG. 2, the operating voltage generating circuit 110 includes a logic circuit 111, a pull-up circuit 112 and a pull-down circuit 113. The logic circuit 111 includes inverters INV1-INV5 and an NAND gate NAND1. An input terminal of the inverter INV1 receives the burnin-test signal TWBT. The inverter INV1 generates an inversion signal SI1 according to the burnin-test signal TWBT. An input terminal of the the inverter INV2 is coupled to an output terminal of the inverter INV1, to receive the inversion signal SI1. The inverter INV2 generates a control signal CT1 according to the inversion signal SI1. An input terminal of the inverter INV3 receives the power start signal INIT0. The inverter INV3 generates an inversion signal SI2 according to the power start signal INIT0. An input terminal of the inverter INV4 is coupled to an output terminal of the inverter INV3, to receive the inversion signal SI2. The inverter INV4 generates a control signal CT2 according to the inversion signal SI2. An input terminal of the inverter INV5 receives the reverse bias enable signal VBBE and the inverter INV5 generates an inversion signal SI3 according to the reverse bias enable signal VBBE. A first terminal of the NAND gate NAND1 is coupled to the output terminal of the inverter INV1 to receive the inversion signal SI1, and a second terminal of the NAND gate NAND1 is coupled to an output terminal of the inverter INV5 to receive the inversion signal SI3. The NAND gate NAND1 performs NAND gate computation on the inversion signals SI1 and SI3, to generate a control signal CT3.

Then, the pull-up circuit 112 is coupled to the logic circuit 111. The pull-up circuit 112 includes transistors MP1-MP2, MN1-MN2. A first terminal of the transistor MP1 receives the operating voltage VDDL, a second terminal of the transistor MP1 is coupled to the power supply voltage VDD, and a control terminal of the transistor MP1 receives the control signal CT2. A first terminal of the transistor MP2 is coupled to a control terminal CP1, a second terminal of the transistor MP2 is coupled to the power supply voltage VDD, and a control terminal of the transistor MP2 receives the control signal CT1. A first terminal of the transistor MN1 is coupled to the control terminal CP1, and a second terminal and a control terminal of the transistor MN1 are jointly coupled to the power supply voltage VDD. A first terminal of the transistor MN2 receives the operating voltage VDDL, a second terminal of the transistor MN2 is coupled to the power supply voltage VDD, and a control terminal of the transistor MN2 is coupled to the control terminal CP1.

In another aspect, the pull-down circuit 113 is coupled between the logic circuit 111 and the pull-up circuit 112. The pull-down circuit 113 includes transistors MN3-MN6. A second terminal of the transistor MN3 receives the operating voltage VDDL, and a control terminal of the transistor MN3 receives the control signal CT3. A first terminal of the transistor MN4 is coupled to the reference grounding terminal GND, a second terminal of the transistor MN4 is coupled to a first terminal of the transistor MN3, and a control terminal of the transistor MN4 receives the control signal CT3. A second terminal of the transistor MN5 is coupled to the control terminal CP1, and a control terminal of the transistor MN5 receives the control signal CT1. A first terminal of the transistor MN6 is coupled to the reference grounding terminal GND, and a second terminal and a control terminal of the transistor MN6 are jointly coupled to a first terminal of the transistor MN5.

Specifically, in the present embodiment, the logic circuit 111 respectively generates control signals CT1-CT3 according to the states of the burnin-test TWBT, the power start signal INIT0 and the reverse bias enable signal VBBE. Then, the pull-up circuit 112 determines whether to turn on the transistors MP1 and MP2 according to the control signal CT1 and the control signal CT2, so as to further adjust the operating voltage VDDL. Moreover, the pull-down circuit 113 determines whether to pull down the voltage level of the operating voltage VDDL according to the control signal CT1 and the control signal CT3.

In particular, in the operating voltage generating circuit 110 of FIG. 2, the inverters INV1-INV4, the transistors MP1-MP2 and the transistors MN1-MN6 are all started by the power supply voltage VDD, while the inverter INV5 and the NAND gate NAND1 are started by the power supply voltage VINT. By the way, the transistors MP1-MP2 of the present embodiment take a P type transistor as an example, while the transistors MN1-MN6 take an N type transistor as an example, but the present invention is not limited herein.

Figure 3:
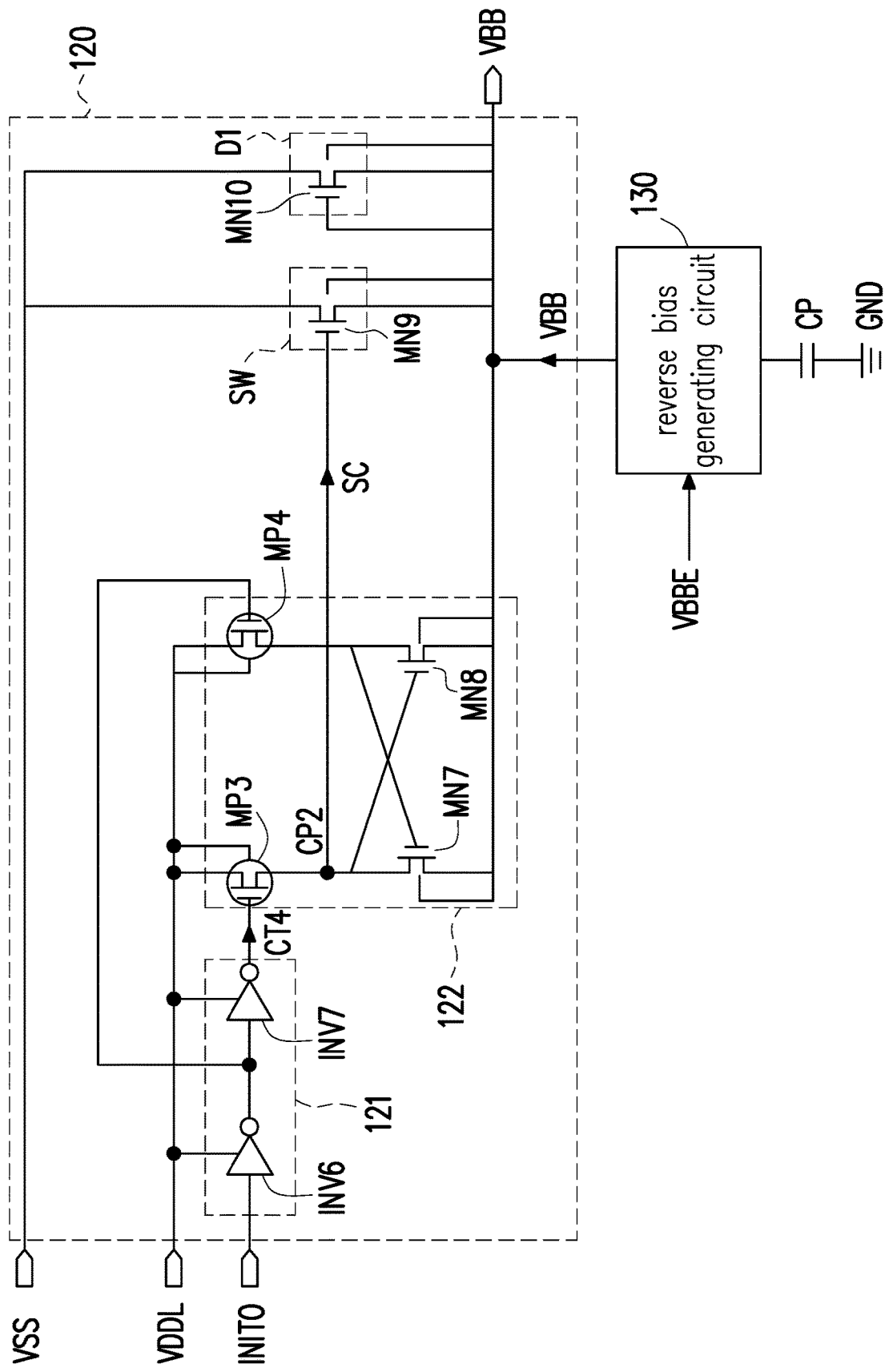
FIG. 3 is a circuit diagram according to a voltage adjusting circuit in FIG. 1 of the present invention.

FIG. 3 is a circuit diagram according to the voltage adjusting circuit 120 in FIG. 1 of the present invention. The voltage adjusting circuit 120 includes a buffer 121, a sense amplifier 122, a switch SW and a diode D1. The buffer 121 includes inverters INV6 and INV7. The buffer 121 generates a control signal CT4 according to the power start signal INIT0. The sense amplifier 122 is coupled to the buffer 121 so as to receive the control signal CT4. And the sense amplifier 122 generates an switching control signal SC according to the control signal CT4 and the power start signal INIT0.

The sense amplifier 122 includes transistors MP3-MP4 and transistors MN7-MN8. A first terminal of the transistor MP3 is coupled to a control terminal CP2, a second terminal of the transistor MP3 receives the operating voltage VDDL, and a control terminal of the transistor MP3 receives the control signal CT4. A second terminal of the transistor MP4 receives the operating voltage VDDL, and a control terminal of the transistor MP4 is coupled to an output terminal of the inverter INV6. A first terminal of the transistor MN7 receives the reverse bias voltage VBB, a second terminal of the transistor MN7 is coupled to the control terminal CP2, and a control terminal of the transistor MN7 is coupled to a first terminal of the transistor MP4. A first terminal of the transistor MN8 receives the reverse bias voltage VBB, a second terminal of the transistor MN8 is coupled to the first terminal of the transistor MP4, and a control terminal of the transistor MN8 is coupled to the control terminal CP2.

In another aspect, the switch SW is coupled to the control terminal CP2 to receive the switching control signal SC. The switch SW determines whether to adjust the voltage level of the reverse bias voltage VBB to the voltage level of the reference grounding voltage VSS according to the switching control signal SC. The switch SW in the present embodiment is implemented by a transistor MN9. A first terminal of the transistor MN9 receives the reverse bias voltage VBB, a second terminal of the transistor MN9 is coupled to the reference grounding voltage VSS, and a control terminal of the transistor MN9 is coupled to the control terminal CP2. It is worth mentioning that a transistor MN10 of the present embodiment forms the diode D1 according to a connecting mode of diode configuration. The diode D1 is coupled between the sense amplifier 122 and the reference grounding voltage VSS. An anode (that is, a first terminal of the transistor MN10) of the diode receives the reverse bias voltage VBB, and a cathode (that is, a second terminal of the transistor MN10) of the diode is coupled to the reference grounding voltage VSS.

Moreover, in the present embodiment, the reverse bias generating circuit 130 is coupled to the voltage adjusting circuit 120. The reverse bias generating circuit 130 generates a reverse bias voltage VBB by a capacitor CP pump according to the reverse bias enable signal VBBE.

By the way, the transistors MP3-MP4 of the present embodiment take the P type transistor as an example, while the transistors MN7-MN10 take the N type transistor as an example, but the present invention is not limited herein.

Figure 4:
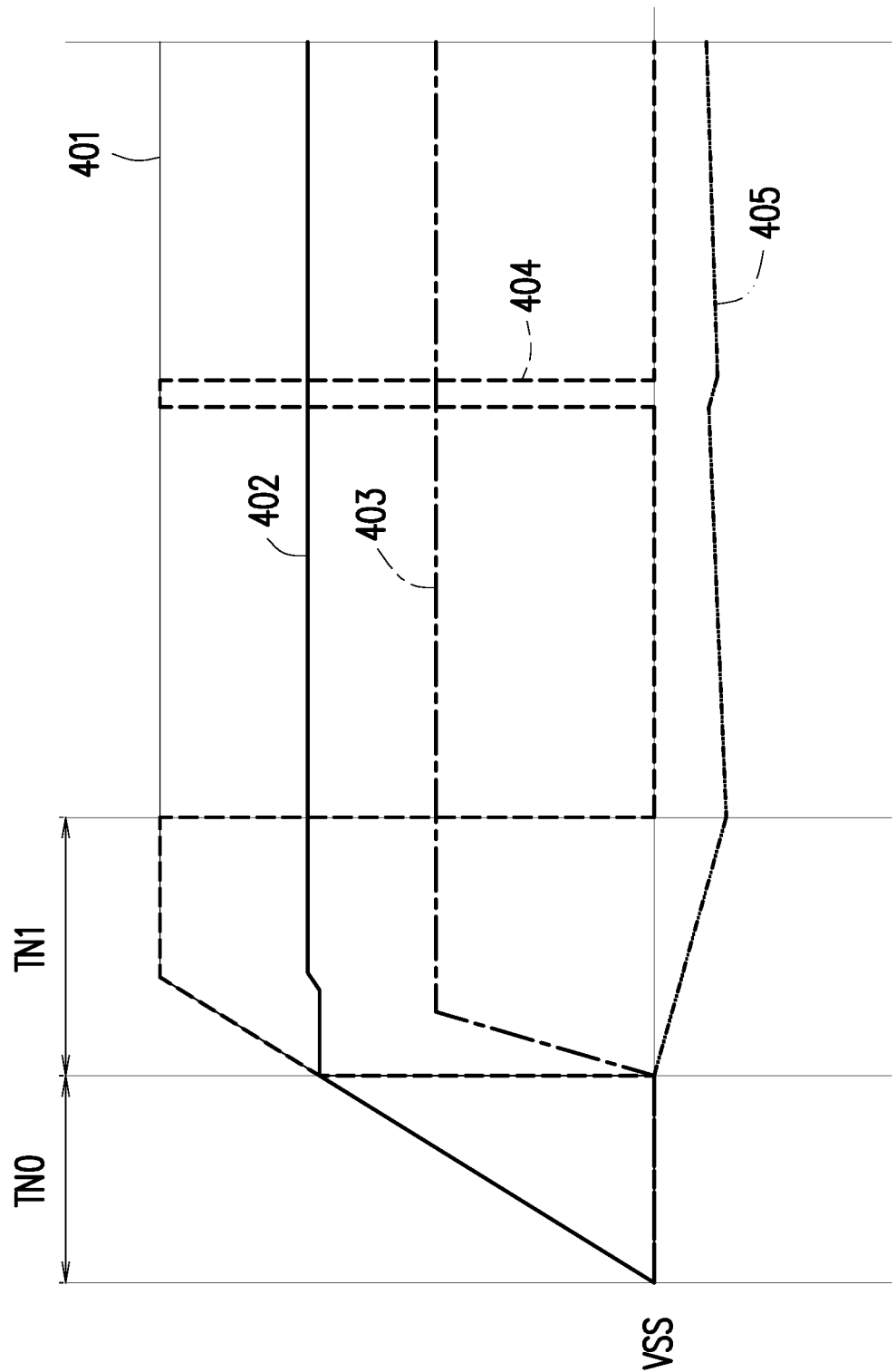
FIG. 4 is a wave form schematic diagram of the reverse bias voltage adjuster in a normal operation mode according to an embodiment of the present invention.

FIG. 4 is a wave form schematic diagram of the reverse bias voltage adjuster 100 in a normal operation mode according to an embodiment of the present invention. Please refer to FIG. 1 to FIG. 4 simultaneously for the operational details of the reverse bias voltage adjuster 100 operating in a normal operation state. Specifically, when the reverse bias voltage adjuster 100 operates in the normal operation state, the burnin-test signal TWBT is continuously set as a disabled (for example, a low-voltage level) state, and when the burnin-test signal TWBT is in the initial time interval TN0 in the normal operation mode, the voltage value of the power supply voltage VDD is less than the preset voltage value. Correspondingly, in the time interval after the initial time interval TN0 in the normal operation mode, the voltage value of the power supply voltage VDD is greater than the preset voltage value.

What needs to be noted is that in FIG. 4, wave form 401, wave form 402, wave form 403, wave form 404 and wave form 405 are respectively corresponding to the operation states of the power start signal INIT0, the operating voltage VDDL, the power supply voltage VINT, the reverse bias enable signal VBBE and the reverse bias voltage VBB in each time interval.

In detail, when the reverse bias voltage adjuster 100 operates in the initial time interval TN0, the operating voltage generating circuit 110 provides the control signal CT2 to the pull-up circuit 112 according to the power start signal INIT0 (for example, the wave form 401) with a low-voltage level by utilizing the logic circuit 111. Then the pull-up circuit 112 turns on the transistor MP1 according to the control signal CT2 with a low-voltage level. In other words, at the moment, the pull-up circuit 112 sets the voltage value (for example, the wave form 402) of the operating voltage VDDL as the voltage value of the power supply voltage VDD according to the control signal CT2.

In another aspect, in the initial time interval TN0, the voltage adjusting circuit 120 provides the control signal CT4 to the sense amplifier 122 according to the power start signal INIT0 with a low-voltage level by utilizing the buffer 121. Then, the sense amplifier 122 turns on the transistor MP3 according to the control signal CT4 with a low-voltage level, so as to charge the control terminal CP2. Then, the sense amplifier 122 generates the switching control signal SC with a high-voltage level according to the power start signal INIT0 and the operating voltage VDDL, so that the switch SW is turned on according to the switching control signal SC. Therefore, when the reverse bias voltage adjuster 100 operates in the initial time interval TN0, the voltage adjusting circuit 120 maintains the voltage level (for example, the wave form 405) of the reverse bias voltage VBB at the voltage level of the reference grounding voltage VSS.

In another aspect, when the reverse bias voltage adjuster 100 operates in the time interval TN1 after the initial time interval TN0, the voltage value of the power supply voltage VDD at the moment is greater than the preset voltage value, and thus the power start signal INIT0 is set in an enabled (for example, the high-voltage level) state.

Specifically, in the time interval TN1, the operating voltage generating circuit 110 respectively provides the control signal CT1 and the control signal CT2 to the pull-up circuit 112 according to the burnin-test signal TWBT with a low-voltage level and the power start signal INIT0 with a high-voltage level. Then, the pull-up circuit 112 turns on the transistor MP2 according to the control signal CT1 with a low-voltage level, so as to charge the control terminal CP1. Moreover, the pull-up circuit 112 also turns off the transistor MP1 according to the control signal CT2 with a high-voltage level.

Under such circumference, the voltage level of the control terminal CP1 is charged to the high-voltage level by a turning-on path of the transistor MP2, so the pull-up circuit 112 turns on the transistor MN2 according to the voltage level of the control terminal CP1. In other words, when the reverse bias voltage adjuster 100 operates in the time interval TN1, the pull-up circuit 112 adjusts the voltage value of the operating voltage VDDL to be a difference value (for example, VDDL=VDD−VTN2, wherein VDDL is the voltage value of the operating voltage VDDL, VDD is the voltage value of the power supply voltage VDD, and VTN2 is the voltage value of the threshold voltage of the transistor MN2) between the power supply voltage VDD and the threshold voltage VTN2 of the transistor MN2 according to the control signal CT1 and the control signal CT2. That is, the voltage value of the operating voltage VDDL at the moment is the first voltage value.

In another aspect, in the time interval TN1, the voltage adjusting circuit 120 provides the control signal CT4 to the sense amplifier 122 according to the power start signal INIT0 with a high-voltage level by utilizing the buffer 121. Then, the sense amplifier 122 turns off the transistor MP3 according to the control signal CT4 with a high-voltage level, and generates the switching control signal SC with a low-voltage level according to the power start signal INIT0 and the operating voltage VDDL, so that the switch SW is turned off according to the switching control signal SC.

Under such circumference, the reverse bias enable signal VBBE (for example, the wave form 404) and the power supply voltage VINT (for example, the wave form 403) are set in enabled state, and the reverse bias generating circuit 130 provides a reverse bias voltage VBB with a negative voltage level (for example, −0.5V, but the present invention is not limited therein) according to the reverse bias enable signal VBBE, so that each transistor in the memory cell array also normally acts in the normal operation mode.

Figure 5:
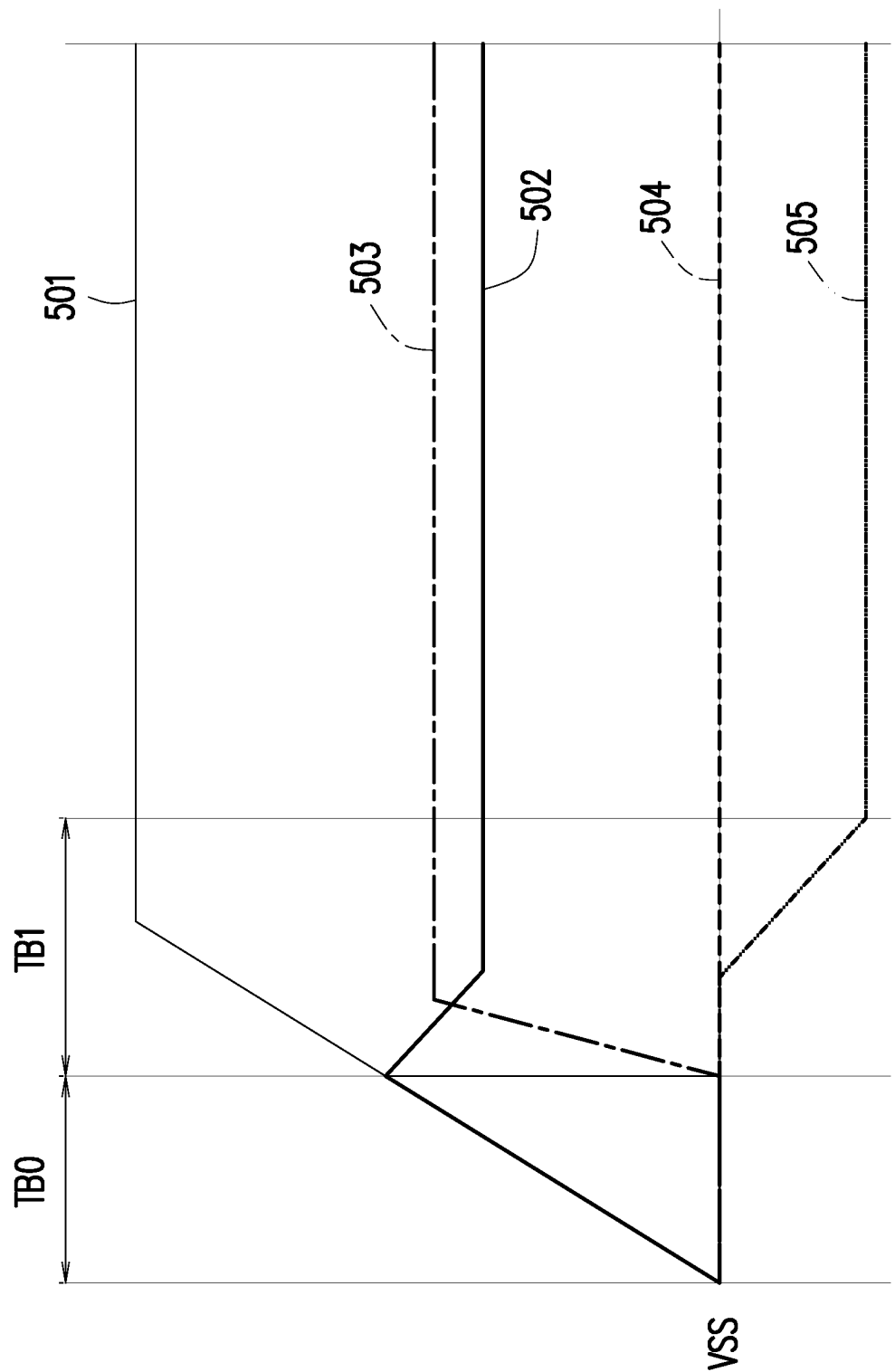
FIG. 5 is a wave form schematic diagram of the reverse bias voltage adjuster in a burnin-test mode according to an embodiment of the present invention.

FIG. 5 is a wave form schematic diagram of the reverse bias voltage adjuster 100 in the burnin-test mode according to an embodiment of the present invention. Please refer to FIG. 1 to FIG. 3 and FIG. 5 simultaneously for the operational details of the reverse bias voltage adjuster 100 operating in the burnin-test operation mode. Specifically, when the reverse bias voltage adjuster 100 operates in the burnin-test operation mode, the burnin-test signal TWBT is continuously set in the enabled (for example, the high-voltage level) state, and the voltage value of the power supply voltage VDD is less than the preset voltage value in the initial time interval TB0 in the burnin-test mode. Correspondingly, in the time interval after the initial time interval TB0 in the burnin-test mode, the voltage value of the power supply voltage VDD is greater than the preset voltage value.

What needs to be noted is that, in FIG. 4, wave form 501, wave form 502, wave form 503, wave form 504 and wave form 505 are respectively corresponding to the operation states of the power start signal INIT0, the operating voltage VDDL, the power supply voltage VINT, the reverse bias enable signal VBBE and the reverse bias voltage VBB in each time interval.

Specifically, when the reverse bias voltage adjuster 100 operates in the initial time interval TB0, the operating voltage generating circuit 110 provides the control signal CT2 to the pull-up circuit 112 according to the power start signal INIT0 (for example, the wave form 501) with a low-voltage level by utilizing the logic circuit 111. Then, the pull-up circuit 112 turns on the transistor MP1 according to the control signal CT2 with a low-voltage level. In other words, at the moment, the pull-up circuit 112 sets the voltage value (for example, the wave form 502) of the operating voltage VDDL as the voltage value of the power supply voltage VDD according to the control signal CT2.

In another aspect, in the initial time interval TB0, the voltage adjusting circuit 120 provides the control signal CT4 to the sense amplifier 122 according to the power start signal INIT0 with a low-voltage level by utilizing the buffer 121. Then, the sense amplifier 122 turns on the transistor MP3 according to the control signal CT4 with a low-voltage level, so as to charge the control terminal CP2. Then, the sense amplifier 122 generates the switching control signal SC with a high-voltage level according to the power start signal INIT0 and the operating voltage VDDL, so that the switch SW is turned on according to the switching control signal SC. Thus, when the reverse bias voltage adjuster 100 operates in the initial time interval TB0, the voltage adjusting circuit 120 maintains the voltage level (for example, the wave form 505) of the reverse bias voltage VBB at the voltage level of the reference grounding voltage VSS via the turning-on path of the switch SW.

In another aspect, when the reverse bias voltage adjuster 100 operates in the time interval TB1 after the initial time interval TB0, at the moment, the voltage value of the power supply voltage VDD is greater than the preset voltage value, and therefore, the power start signal INIT0 is set in the enabled (for example, the high-voltage level) state.

Specifically, in the time interval TB1, the operating voltage generating circuit 110 respectively provides the control signal CT1 and the control signal CT2 to the pull-up circuit 112 according to the burnin-test signal TWBT with a high-voltage level and the power start signal INIT0 with a high-voltage level by utilizing the logic circuit 111. Then, the pull-up circuit 112 respectively turns off the transistor MP2 and the transistor MP1 according to the control signal CT1 with a high-voltage level and the control signal CT2 with a high-voltage level.

Under such circumference, the transistor MN1 is in the turning-on state at the moment, the voltage level of the control terminal CP1 is adjusted to be a difference value between the power supply voltage VDD and the threshold voltage VTN1 of the transistor MN1 according to the turning-on path of the transistor MN1. In other words, when the reverse bias voltage adjuster 100 operates in the time interval TB1, the pull-up circuit 112 adjusts the voltage value of the operating voltage VDDL to be the difference value(for example, VDDL=VDD−(VTN1+VTN2), wherein VDDL is the voltage value of the operating voltage VDDL; VDD is the voltage value of the power supply voltage VDD; VTN1 is the voltage value of the threshold voltage of the transistor MN1; and VTN2 is the voltage value of the threshold voltage of the transistor MN2) between the power supply voltage VDD and the threshold voltages of the transistors MN1 and MN2 according to the control signal CT1 and the control signal CT2. That is, the voltage value of the operating voltage VDDL at the moment is the second voltage value.

In another aspect, in the time interval TB1, the voltage adjusting circuit 120 provides the control signal CT4 to the sense amplifier 122 according to the power start signal INIT0 with a high-voltage level by utilizing the buffer 121. Then, the sense amplifier 122 turns off the transistor MP3 according to the control signal CT4 with a high-voltage level, and generates the switching control signal SC with a low-voltage level according to the power start signal INIT0 and the operating voltage VDDL, so that the switch SW is turned off according to the switching control signal SC.

Under such circumference, the reverse bias enable signal VBBE (for example, the wave form 504) is set in a disabled state and the power supply voltage VINT (for example, the wave form 503) is set in an enabled state, and the reverse bias generating circuit 130 provides a reverse bias voltage VBB with a negative voltage level (for example, −1V, but the present invention is not limited herein) according to the reverse bias enable signal VBBE, so that each transistor in the memory cell array also normally acts in the normal operation mode.

To sum up, the reverse bias voltage adjuster disclosed by the present invention provides the operating voltage with the second voltage value less than the first voltage value by utilizing the operating voltage generating circuit in the initial time interval in the burnin-test mode. In this way, although the voltage value of the power supply voltage operating in the burnin-test mode is higher than the voltage value of the power supply voltage operating in the normal operation mode, the reverse bias voltage adjuster maintains the voltage level of the reverse bias voltage at the voltage level of the reference grounding voltage according to the pulled-down operating voltage and the power start signal by utilizing the voltage adjusting circuit, so as to effectively reduce the voltage difference between the source terminal and the drain terminal of each transistor in the memory cell array, to avoid the situation that the transistors are damaged.

Although the present invention has been disclosed above through the embodiments, the embodiments are not intended to limit the present invention, any person with common knowledge in the belonged technical field can make some alternations and modifications without deviating from the spirit or scope of the present invention, and therefore, the protection scope of the present invention should be subject to the appended claims.

What is claimed is:

1. A reverse bias voltage adjuster, comprising:
an operating voltage generating circuit, which generates an operating voltage according to a burnin-test signal, a power start signal, and a reverse bias enable signal, wherein in a normal operation mode, the operating voltage is a first voltage value, and in a burnin-test mode, the operating voltage is a second voltage value, and the second voltage value is less than the first voltage value; and
a voltage adjusting circuit, which is coupled to the operating voltage generating circuit, and is provided with a switch, wherein the switch is coupled between transfer trajectories of a reference grounding voltage and a reverse bias voltage, and in an initial time interval in the burnin-test mode, the voltage adjusting circuit adjusts voltage value of the reverse bias voltage by turning on the switch.

2. The reverse bias voltage adjuster according to claim 1, wherein the reverse bias voltage adjuster further comprises:
a reverse bias generating circuit, which is coupled to the voltage adjusting circuit, and generates the reverse bias voltage by a capacitor according to the reverse bias enable signal.

3. The reverse bias voltage adjuster according to claim 1, wherein in the initial time interval in the burnin-test mode, the voltage adjusting circuit adjusts the voltage value of the reverse bias voltage according to the operating voltage and the power start signal so that the voltage value of the reverse bias voltage is maintained at the voltage value of the reference grounding voltage.

4. The reverse bias voltage adjuster according to claim 3, wherein when a voltage value of a power supply voltage is less than a preset voltage value, the power start signal is set as a first logic level, and when the voltage value of the power supply voltage is greater than the preset voltage value, the power start signal is set as a second logic level.

5. The reverse bias voltage adjuster according to claim 4, wherein the operating voltage generating circuit comprises:
a logic circuit, which generates a first control signal, a second control signal and a third control signal respectively according to the burnin-test signal, the power start signal and the reverse bias enable signal;
a pull-up circuit, which is coupled to the logic circuit to receive the first control signal and the second control signal, and pulls up the operating voltage according to the first control signal and the second control signal; and
a pull-down circuit, which is coupled to the logic circuit and the pull-up circuit to receive the first control signal and the third control signal, and pulls down the operating voltage according to the first control signal and the third control signal.

6. The reverse bias voltage adjuster according to claim 5, wherein the logic circuit comprises:
a first inverter, wherein an input terminal of the first inverter receives the burnin-test signal, and the first inverter generates a first inversion signal according to the burnin-test signal;
a second inverter, wherein an input terminal of the second inverter is coupled to an output terminal of the first inverter, and the second inverter generates the first control signal according to the first inversion signal;
a third inverter, wherein an input terminal of the third inverter receives the power start signal, and the third inverter generates a second inversion signal according to the power start signal;
a fourth inverter, wherein an input terminal of the fourth inverter is coupled to an output terminal of the third inverter, and the fourth inverter generates the second control signal according to the second inversion signal;
a fifth inverter, wherein an input terminal of the fifth inverter receives the reverse bias enable signal, and the fifth inverter generates a third inversion signal according to the reverse bias enable signal; and
an NAND gate, wherein a first terminal of the NAND gate is coupled to the output terminal of the first inverter, and a second terminal of the NAND gate is coupled to an output terminal of the fifth inverter, and the NAND gate generates the third control signal according to the first inversion signal and the third inversion signal.

7. The reverse bias voltage adjuster according to claim 6, wherein the pull-up circuit comprises:
a first transistor, wherein a first terminal of the first transistor receives the operating voltage, a second terminal of the first transistor is coupled to the power supply voltage, and a control terminal of the first transistor receives the second control signal;
a second transistor, wherein a first terminal of the second transistor is coupled to a first control terminal, a second terminal of the second transistor is coupled to the power supply voltage, and a control terminal of the second transistor receives the first control signal;
a third transistor, wherein a first terminal of the third transistor is coupled to the first control terminal, and a second terminal of the third transistor and a control terminal of the third transistor are jointly coupled to the power supply voltage; and
a fourth transistor, wherein a first terminal of the fourth transistor is coupled to the operating voltage, a second terminal of the fourth transistor is coupled to the power supply voltage, and a control terminal of the fourth transistor is coupled to the first control terminal.

8. The reverse bias voltage adjuster according to claim 7, wherein the pull-down circuit comprises:
a fifth transistor, wherein a second terminal of the fifth transistor is coupled to the operating voltage, and a control terminal of the fifth transistor receives the third control signal;

a sixth transistor, wherein a first terminal of the sixth transistor is coupled to a reference grounding terminal, a second terminal of the sixth transistor is coupled to a first terminal of the fifth transistor, and a control terminal of the sixth transistor receives the third control signal;

a seventh transistor, wherein a second terminal of the seventh transistor is coupled to the first control terminal, and a control terminal of the seventh transistor receives the first control signal; and an eighth transistor, wherein a first terminal of the eighth transistor is coupled to the reference grounding terminal, and a second terminal of the eighth transistor and a control terminal of the eighth transistor are jointly coupled to a first terminal of the seventh transistor.

9. The reverse bias voltage adjuster according to claim 8, wherein the voltage adjusting circuit comprises:

a buffer, generating a fourth control signal according to the power start signal;

a sense amplifier, coupled to the buffer, and generating an switching control signal according to the fourth control signal and the power start signal;

the switch, coupled between the sense amplifier and the reference grounding voltage, and adjusting the voltage value of the reverse bias voltage according to the switching control signal; and a diode, coupled between the sense amplifier and the reference grounding voltage.

10. The reverse bias voltage adjuster according to claim 9, wherein the switch comprises:

a ninth transistor, wherein a first terminal of the ninth transistor receives the reverse bias voltage, a second terminal of the ninth transistor receives the reference grounding voltage, and a control terminal of the ninth transistor receives the switching control signal.

* * * * *